United States Patent
Ono et al.

(10) Patent No.: US 9,153,792 B2
(45) Date of Patent: Oct. 6, 2015

(54) ORGANIC ELECTROLUMINESCENCE DEVICE INCLUDING AUXILIARY ELECTRODES

(75) Inventors: Tomio Ono, Kanagawa-ken (JP); Shintaro Enomoto, Kanagawa-ken (JP); Yukitami Mizuno, Minato-ku (JP); Isao Takasu, Minato-ku (JP); Yasushi Shinjiyo, Kanagawa-ken (JP); Shuichi Uchikoga, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1217 days.

(21) Appl. No.: 13/081,945

(22) Filed: Apr. 7, 2011

(65) Prior Publication Data

US 2011/0180835 A1 Jul. 28, 2011

Related U.S. Application Data

(63) Continuation of application No. PCT/JP2009/003739, filed on Aug. 5, 2009.

(51) Int. Cl.
*H01L 51/52* (2006.01)
*H01L 27/15* (2006.01)

(52) U.S. Cl.
CPC ........ *H01L 51/5271* (2013.01); *H01L 51/5212* (2013.01); *H01L 51/5275* (2013.01); *H01L 2251/5361* (2013.01); *H01L 2251/558* (2013.01)

(58) Field of Classification Search
USPC .............................................. 257/98, E51.018
IPC .................. H01L 51/5212,51/5271, 2251/5307, H01L 2251/5361
See application file for complete search history.

(56) References Cited

U.S. PATENT DOCUMENTS

2007/0096112 A1* 5/2007 Hoshi .............................. 257/79
2009/0115325 A1* 5/2009 Matsuzaki et al. ............ 313/504
2009/0315043 A1 12/2009 Nakamura et al.

FOREIGN PATENT DOCUMENTS

| JP | 61-28123 | | 2/1986 |
| JP | 9-330792 A | | 12/1997 |
| JP | 10-270173 | | 10/1998 |
| JP | 10270173 A | * | 10/1998 |
| JP | 2002-83692 A | | 3/2002 |

(Continued)

OTHER PUBLICATIONS

U.S. Appl. No. 14/045,133, filed Oct. 3, 2013, Ono, et al.
G. Gu et al., "High-external-quantum-efficiency organic light-emitting devices", Optics Letters, vol. 22, No. 6 (1997) pp. 396-398.
U.S. Appl. No. 13/413,027, filed Mar. 6, 2012, Sawabe et al.
U.S. Appl. No. 12/872,281, filed Aug. 31, 2010, Yonehara, et al.
Office Action issued Aug. 21, 2013 in Japanese Patent Application No. 2011-525691 (with English-language translation).
Japanese Office Action issued Nov. 5, 2012, in Japan Patent Application No. 2011-525691 (with English translation).
Office Action issued on Jan. 8, 2014 in the corresponding Japanese Patent Application No. 2011-525691 (with English Translation).

*Primary Examiner* — Marcos D Pizarro
(74) *Attorney, Agent, or Firm* — Oblon, McClelland, Maier & Neustadt, L.L.P.

(57) ABSTRACT

According to one embodiment, in an organic electroluminescence device, a first substrate has a first refractive index n1. A second substrate is joined to an upper surface of the first substrate and has a second refractive index n2 higher than the first refractive index n1. Multiple wedge-shaped metal lines are buried in the second substrate in such a manner that one side of the wedge-shaped metal line is flush with an upper surface of the second substrate. A transparent electrode is formed on the upper surface of the second substrate and the multiple metal lines. An insulating layer is formed on a portion of the transparent electrode opposed to the multiple metal lines. An organic light emitting layer is formed on the transparent electrode on which the insulating layer is formed. A metal electrode is formed on the organic light emitting layer.

4 Claims, 8 Drawing Sheets

(56) References Cited

FOREIGN PATENT DOCUMENTS

| JP | 2003-282263 | 10/2003 |
| JP | 2003-308026 | 10/2003 |
| JP | 2004-22518 A | 1/2004 |
| JP | 2007-80579 | 3/2007 |
| JP | 2008-66385 A | 3/2008 |
| JP | 2008-158533 | 7/2008 |

* cited by examiner

FIRST EMBODIMENT

COMPARATIVE EXAMPLE

ORGANIC ELECTROLUMINESCENCE DEVICE INCLUDING AUXILIARY ELECTRODES

CROSS REFERENCE TO RELATED APPLICATION

This application is based upon and claims the benefit of priority from PCT/JP2009/003739, filed on Aug. 7, 2009, the entire contents of which are incorporated herein by reference.

FIELD

Embodiments described herein relate generally to an organic electroluminescence device and a method for manufacturing the organic electroluminescence device.

BACKGROUND

An organic electroluminescence device is a light emitting device making use of light emission from radiative deactivation of excitons. The excitons are generated by applying a voltage to the organic light emitting layer interposed between a pair of electrodes, and by thereby recombining electrons and holes injected from a cathode and an anode, respectively, into an organic light emitting layer.

There have heretofore been known organic electroluminescence devices using substrates (shaped substrates) processed into the form of mesas in order to enhance light extraction efficiency from an organic light emitting layer (Optics Letters, 22, 396 (1997)).

In such an organic electroluminescence device, a high refractive index layer having a higher refractive index than an organic light emitting layer is formed on a glass substrate, then the high refractive index layer and the glass substrate are shaped to have mesas, and the organic light emitting layer interposed between a transparent electrode and a metal electrode is formed on the high refractive index layer.

Moreover, a metal mirror is formed on sidewalls of the mesa, a polyimide layer to planarize the mesa is formed on the metal mirror, and a metal line contacting the transparent electrode is formed on the polyimide layer.

When light enters the high refractive index layer from the organic light emitting layer, the light traveling in a lateral direction inside the high refractive index layer is reflected by the metal mirror and is bent to travel toward the glass substrate so that the light can be extracted out of the organic electroluminescence device.

In the organic electroluminescence device, the light travels in the lateral direction inside the high refractive index layer while repeating total reflection by an interface between the high refractive index layer and the glass substrate and specular reflection by the metal electrode. Since the high refractive index layer is thin, the light is inevitably reflected a large number of times per unit length.

As a result, the light traveling in the lateral direction is rapidly attenuated in accordance with the number of reflections. Thus, as a distance between adjacent mesas, i.e., a distance between metal lines increases, the light reaching the metal mirror decreases and an improving effect of light extraction efficiency is impaired. This causes a problem of difficulty in producing an organic electroluminescence device with a larger area.

Moreover, there is another problem that manufacturing the organic electroluminescence device requires a lot of time and cost because manufacturing processes of the organic electroluminescence device are complicated.

BRIEF DESCRIPTION OF THE DRAWINGS

FIG. 1A is a plan view of the organic electroluminescence device. FIG. 1B is a cross-sectional view taken along line A-A in FIG. 1A and viewed in a direction indicated by arrows;

DETAILED DESCRIPTION

Figure 1A:
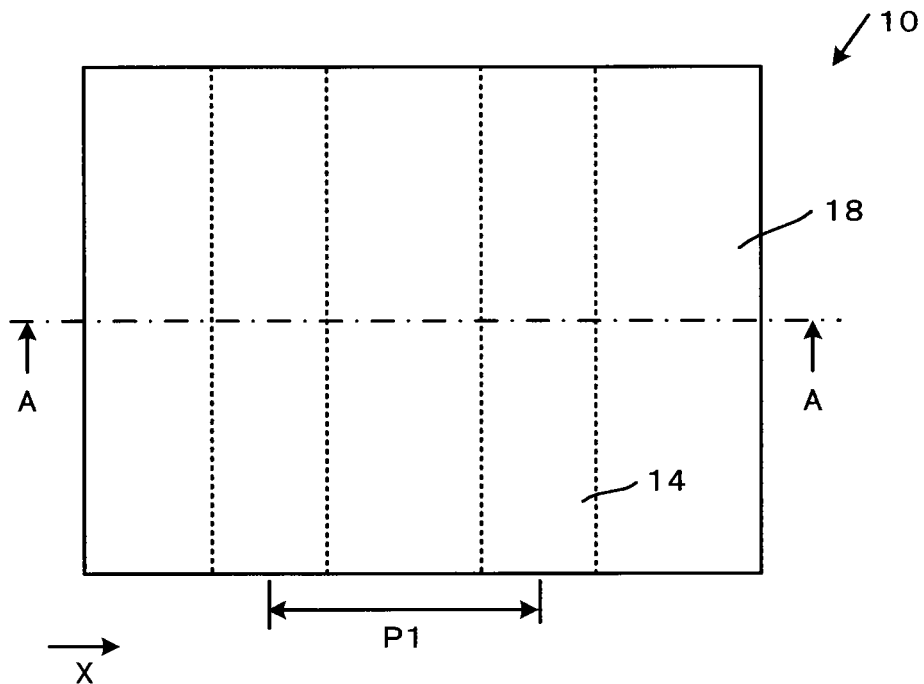
FIGS. 1A and 1B are views showing an organic electroluminescence device according to a first embodiment.

According to one embodiment, in an organic electroluminescence device, a first substrate has a first refractive index n1. A second substrate is joined to an upper surface of the first substrate and has a second refractive index n2 higher than the first refractive index n1. Multiple wedge-shaped metal lines are buried in the second substrate in such a manner that one side of the wedge-shaped metal line is flush with an upper surface of the second substrate. A transparent electrode is formed on the upper surface of the second substrate and the multiple metal lines. An insulating layer is formed on a portion of the transparent electrode opposed to the multiple metal lines. An organic light emitting layer is formed on the transparent electrode on which the insulating layer is formed. A metal electrode is formed on the organic light emitting layer.

According to another embodiment, in a method for manufacturing an organic electroluminescence device, a composite substrate by joining a second substrate to an upper surface of a first substrate having a first refractive index is formed. The second substrate has a second refractive index higher than the first refractive index and having a plurality of wedge-shaped metal lines each buried in the second substrate in such a manner that one side of the wedge-shaped metal line is flush with an upper surface of the second substrate. A transparent electrode is formed on the upper surface of the second substrate and the plurality of metal lines. An insulating layer is formed on a portion of the transparent electrode opposed to the plurality of metal lines. An organic light emitting layer is formed by coating an organic light emitting material on the transparent electrode on which the insulating layer is formed and a metal electrode is formed on the organic light emitting layer.

Hereinafter, further embodiments will be described with reference to the drawings. In the drawings, same reference characters denote the same or similar portions.

First Embodiment

Figure 1B:
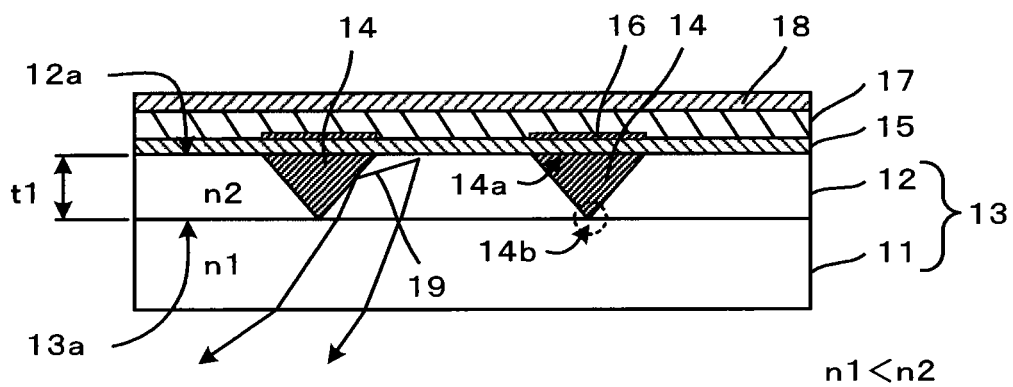

A first embodiment will be described with reference to FIGS. 1A and 1B. FIGS. 1A and 1B are views showing an organic electroluminescence device. FIG. 1A is a plan view of the organic electroluminescence device. FIG. 1B is a cross-sectional view taken along line A-A in FIG. 1A and viewed in a direction indicated by arrows.

As shown in FIGS. 1A and 1B, an organic electroluminescence device 10 of the embodiment includes a composite substrate 13, in which a second substrate 12 having a second refractive index n2 higher than a first refractive index n1 is joined to an upper surface of a first substrate 11 having the first refractive index n1.

The first substrate 11 is made of a plastic such as a polyethylene film having the first refractive index n1 of 1.51 and having a thickness of about 300 μm. The second substrate 12 is made of a plastic such as a polyimide film having the second refractive index n2 of 1.7 and having a thickness t1 of about 100 μm. A joint surface 13a between the first substrate 11 and the second substrate 12, and an upper surface 12a of the second substrate 12 are formed flat.

Multiple metal lines 14 are formed on the second substrate 12. The metal lines 14 are made of aluminum, for example, and have a wedge-shaped cross-sectional structure and a striped planar structure. The metal lines 14 are arranged in parallel at a pitch P1, and are buried in the second substrate 12 in such a manner that one side 14a of the wedge is flush with the upper surface of the second substrate 12, and a vertex 14b of the wedge is in contact with the joint surface 13a of the composite substrate 13.

Here, the metal lines 14 are set in such a manner that the pitch P1 is about 1 mm, the width of the one side 14a of the wedge is about 0.1 mm which is almost equivalent to 1/10 of the pitch P1, and a height to the vertex 14b of the wedge (height of the wedge) is substantially equal to the thickness t1 of the second substrate 12.

The pitch P1 of the metal lines 14 is set to an appropriate interval in accordance with conductivity of a transparent electrode 15 to be described later so that reduction in an amount of luminescence of an organic light emitting layer 17 attributable to a potential drop in a lateral direction (an X direction on a sheet surface) can be ignored.

Meanwhile, in the metal lines 14, both ends of the stripes are connected to one another and are set to the same potential (not shown).

The transparent electrode 15 is formed on the upper surface of the second substrate 12. The transparent electrode 15 is made of an ITO (indium tin oxide) film having a refractive index of 1.8 and having a thickness of about 100 nm, for example, and is formed entirely on the upper surface 12a of the second substrate 12 and the multiple metal lines 14. The transparent electrode 15 constitutes an anode electrode of the organic electroluminescence device 10.

An insulating layer 16 is formed on the transparent electrode 15. The insulating layer 16 is made of a silicon oxide film having a thickness of about 100 nm, for example, and is formed above a portion of the transparent electrode 15 in regions opposed to the metal lines 14.

The insulating film 16 is formed in order to prevent wasteful power consumption by insulating and isolating the organic light emitting layer 17 from the portion of the transparent electrode 15 in the regions opposed to the metal lines 14, because most of the light from the organic light emitting layer 17 to be described later is shielded by the metal lines 14 and cannot be extracted out of the organic electroluminescence device 10.

The organic light emitting layer 17 is formed on the entire upper surface of the transparent electrode 15 that is provided with the insulating layer 16. The organic light emitting layer 17 is made of an organic material film having a refractive index of 1.7 and having a thickness of about 100 nm, for example, and is formed by a coating method, for example.

When a voltage is applied between the transparent electrode 15 and a metal electrode 18 to be described later, electrons and holes are injected into the organic light emitting layer, and the organic light emitting layer 17 emits light due to radiative deactivation of excitons generated by recombination of the electrons and holes.

The metal electrode 18 is formed on the organic light emitting layer 17. The metal electrode 18 is made of an aluminum film having a thickness of about 300 nm and constitutes a cathode electrode of the organic electroluminescence device 10.

According to the organic electroluminescence device having the above-described structure, the composite substrate 13 in which the metal lines 14 are buried and which has the flat upper surface is configured to allow formation of the organic light emitting layer 17 by the coating method, and to enhance light extraction efficiency from the organic light emitting layer 17.

Specifically, an inclined side surface of the wedge-shaped metal line 14 functions as a mirror to bend a path of light 19 that travels in the lateral direction inside the second substrate 12, toward the first substrate 11 located below.

Moreover, when light is incident from the organic light emitting layer 17 onto the second substrate 12, the light repeats total reflection at an interface (the joint surface) 13a between the first substrate 11 and the second substrate 12 and also repeats specular reflection at the metal electrode 18 in the lateral direction inside the second substrate 12. However, since the second substrate 12 is thickly formed to have a thickness of about 100 μm, the number of reflection of the light per unit length inside the second layer 12 is small, so that the light can travel for a long distance without attenuation.

As a result, the light traveling in the lateral direction inside the second substrate 12 reaches the inclined surface of the wedge-shaped metal line 14 even when the pitch P1 is large, whereby probability to be bent toward the first substrate 11 located below and to be incident on the first substrate 11 increases.

In addition, most of light incident from the second substrate 12 onto the first substrate 11 has high probability to take a path downward and is therefore extracted out of the organic electroluminescence device 10 while without being totally reflected at an interface between the first substrate 11 and the air.

Moreover, a propagation path of the light traveling in the lateral direction will be described in detail with reference to FIG. 2A to FIG. 3.

Figure 2A:
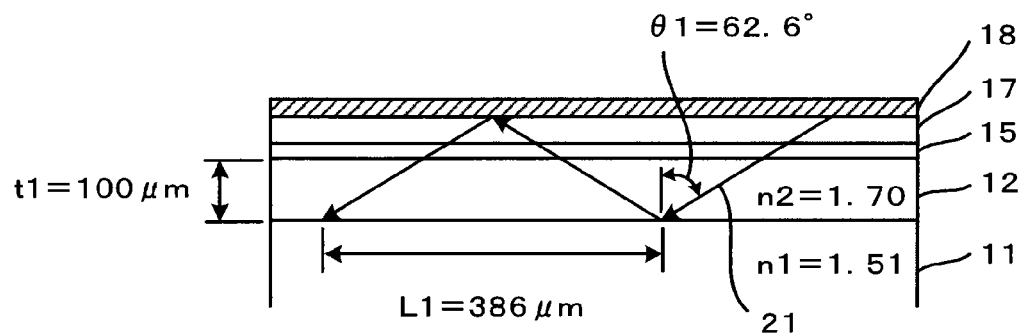
FIGS. 2A and 2B are views showing a propagation path of light traveling in a lateral direction in the organic electroluminescence device in comparison with a comparative example.
Figure 2B:
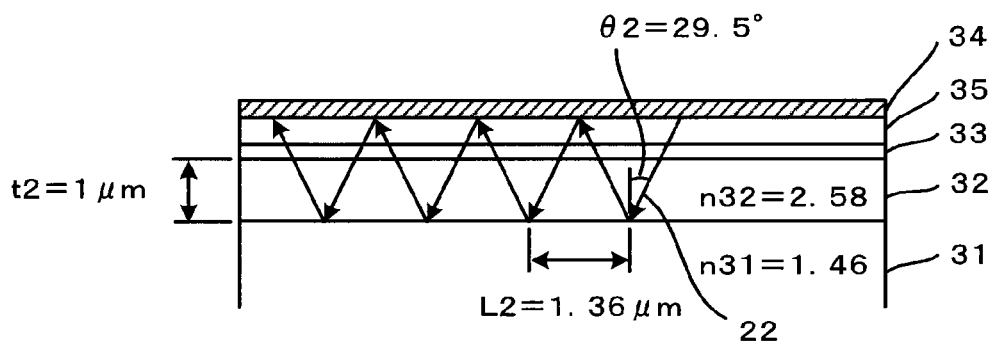
Figure 3:
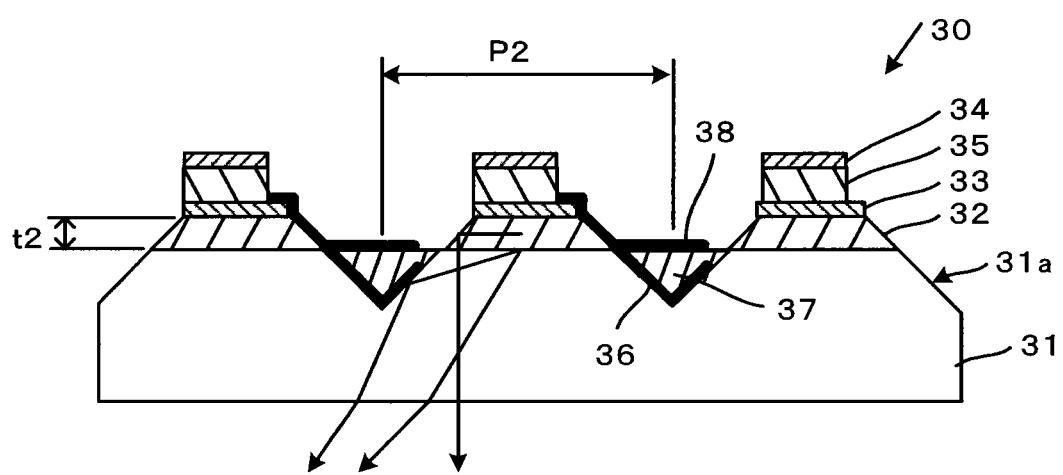
FIG. 3 is a cross-sectional view showing the organic electroluminescence device of the comparative example.

FIGS. 2A and 2B are views to explain a propagation path of the light traveling in the lateral direction in the organic electroluminescence device 10 in comparison with a comparative example. The comparative example means an organic electroluminescence device disclosed in Non-patent Document 1 as shown in FIG. 3.

An organic electroluminescence device 30 of the comparative example has a structure in which a high refractive index layer 32 (TiO$_2$, a thickness ≈1 μm) is formed on a glass substrate 31, the high refractive index layer 32 and the glass substrate 31 are processed to have mesas, and an organic light emitting layer 35 interposed between a transparent electrode (an ITO film) 33 and a metal electrode layer 34 is formed on the high refractive index layer 32.

Moreover, a metal mirror 36 is formed on both of sidewalls of each mesa of the glass substrate 31 and on one of sidewalls of the mesa of the high refractive index layer 32, then a polyimide layer 37 to planarize the mesa is formed on the metal mirror 36 on the glass substrate 31, and a metal line 38 to come in contact with the transparent electrode layer 33 is formed on the polyimide layer 37.

In the first place, the comparative example will be described. As shown in FIG. 2B, in the organic electroluminescence device 30 of the comparative example, the high refractive index layer 32 has a small thickness t2 which is ≈1 µm and an interface between the high refractive index layer 32 and the glass substrate 31 has a small critical angle θ2 (≈29.5°) of total reflection.

Accordingly, while traveling in a lateral direction, light 22 repeats total reflection at the interface between the high refractive index layer 32 and the glass substrate 31 and also repeats specular reflection at the metal electrode 34. Here, since a minimum distance L2 at which the light 22 travels by each reflection is as small as 1.36 µm, the number of reflections per unit length increases.

As a result, the light that travels in the lateral direction is attenuated within a short distance. For example, when the metal electrode 34 has reflectance of 0.9, intensity is decreased almost by half when the light travels for approximately 8 µm (6×L2) at the minimum.

This fact shows that the distance between adjacent mesas, i.e., adjacent metal lines 38 on the glass substrate 31 cannot be increased in order to operate the metal mirror 36 properly.

On the other hand, in the organic electroluminescence device 10 of the embodiment, the first substrate 11 has the large thickness t1 which is ≈100 µm and the interface between the first substrate 11 and the second substrate 12 has a large critical angle θ1 (≈62.6°) of total reflection.

Accordingly, while traveling in a lateral direction, light 21 repeats total reflection at the interface between the first substrate 11 and the second substrate 12 and also repeats specular reflection at the metal electrode 18. Here, since a minimum distance L1 at which the light 21 travels by each reflection is as long as 386 µm, the number of reflections per unit length decreases.

As a result, the light that travels in the lateral direction can travel for a long distance before being attenuated. For example, when the metal electrode 18 has reflectance of 0.9, the light can travel 2 mm or more (6×L1) at the minimum until intensity of the light is decreased by half.

This fact shows that the mirrors of the metal lines 14 can be made to function sufficiently even when the distance between the adjacent metal lines 14 increases.

Therefore, the organic electroluminescence device 10 of the embodiment has a structure in which the pitch P1 of the metal lines 14 can be increased while light extraction efficiency is maintained, and which is suitable for an organic electroluminescence device for use in illumination required to emit light with a large area.

Next, a method for manufacturing the organic electroluminescence device 10 having the above-described structure will be described. FIGS. 4A to 6C are cross-sectional views sequentially showing a manufacturing process of the organic electroluminescence device 10.

First of all, the first substrate 11, the second substrate 12, and the multiple metal lines 14 are prepared.

Figure 4A:
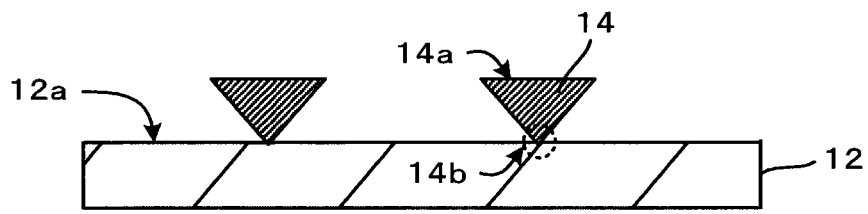
FIGS. 4A, 4B, 4C, and 4D are cross-sectional views sequentially showing a manufacturing process of the organic electroluminescence device.

Next, as shown in FIG. 4A, the multiple wedge-shaped metal lines 14 are heated to a temperature (≈250° C.) which is higher than a temperature (≈200° C.) where polyimide constituting the second substrate 12 becomes softened but which is lower than a temperature (≈350° C.) where polyimide becomes fused, and then the vertexes 14b of the wedges are allowed to abut on the upper surface 12a of the second substrate 12.

The wedge-shaped metal lines 14 are formed by cutting an aluminum plate by using a blade having a V-shaped cross section, for example. Heating of the metal lines 14 can be performed by using various methods including, heating while placing the metal lines 14 on a hot plate, induction-heating by using high-frequency waves, self-heating by applying electrical current, and the like.

Figure 4B:
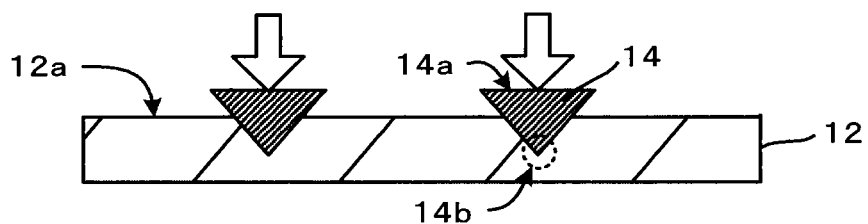

Next, as shown in FIG. 4B, the wedge-shaped metal lines 14 are pushed into the second substrate 12 by pressing the side 14a of the wedge.

Figure 4C:
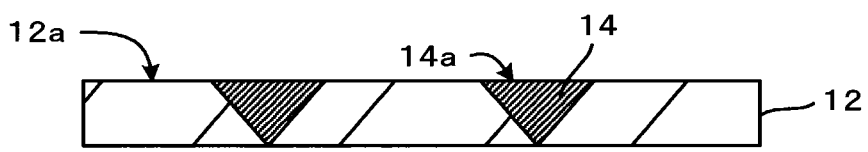

Next, as shown in FIG. 4C, the multiple wedge-shaped metal lines 14 are further pushed such that the side 14a of the wedge becomes flush with the upper surface 12a of the second substrate 12, thereby burying the multiple wedge-shaped metal lines 14 into the second substrate 12.

Figure 4D:
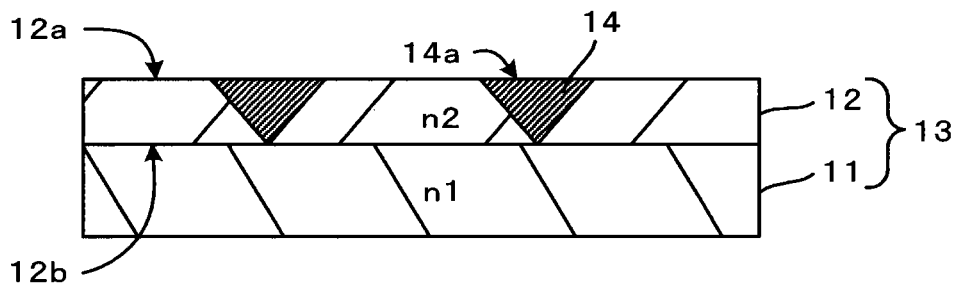

Next, as shown in FIG. 4D, a lower surface 12b of the second substrate 12 is stacked on the upper surface of the first substrate 11, and thermocompression bonding is performed. Thereby, the first substrate 11 and the second substrate 12 are joined to each other. In this way, the second substrate 12 in which the multiple metal lines 14 are buried and which has the second refractive index n2 higher than the first refractive index n1 is joined onto the first substrate 11 having first refractive index n1, and thereby, the composite substrate 13 having the flat upper surface is obtained.

Figure 5A:
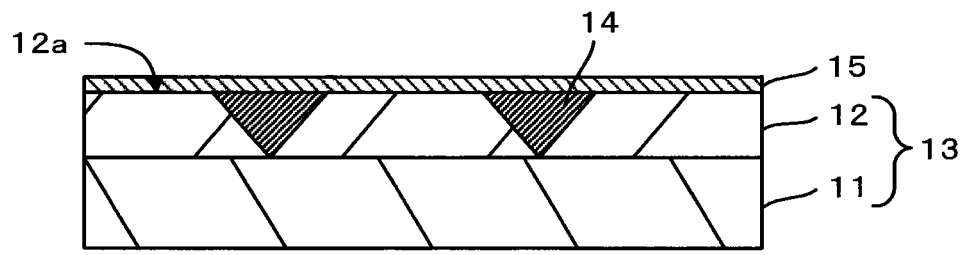
FIGS. 5A, 5B, and 5C are cross-sectional views sequentially showing the manufacturing process of the organic electroluminescence device.

Next, as shown in FIG. 5A, an ITO film having a thickness of about 100 nm is formed by a sputtering method, for example, entirely on the second substrate 12 and the upper surfaces 12a of the multiple wedge-shaped metal lines 14 as the transparent electrode 15.

Figure 5B:
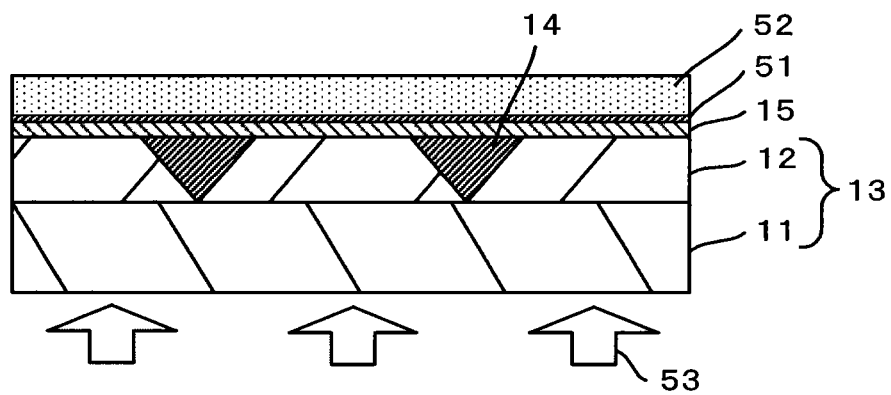

Next, as shown in FIG. 5B, a silicon oxide film 51 as the insulating film is formed in a thickness of about 100 nm entirely on the transparent electrode 15 by a sputtering method, for example, and then a resist film 52 is formed on the silicon oxide film 51. Thereafter, light 53 is irradiated onto the resist film 52 from the lower surface side of the first substrate 11, with the multiple metal lines 14 used as a mask.

Figure 5C:
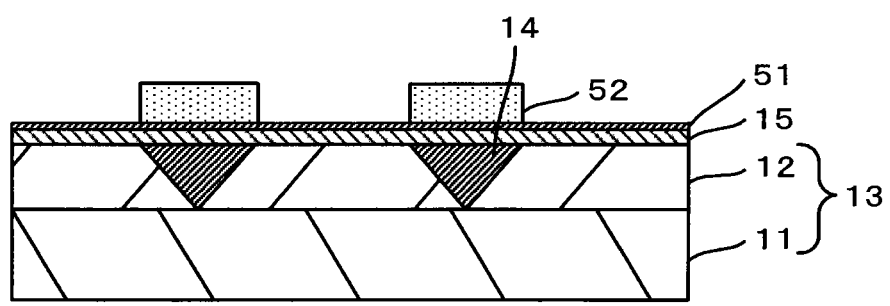

Next, as shown in FIG. 5C, the resist film 52 is developed and then the resist film 52 in a region on which the light 53 is irradiated is selectively removed and the resist film 52 is left on a portion of the silicon oxide film 51 in regions opposed to the multiple wedge-shaped metal lines 14.

Figure 6A:
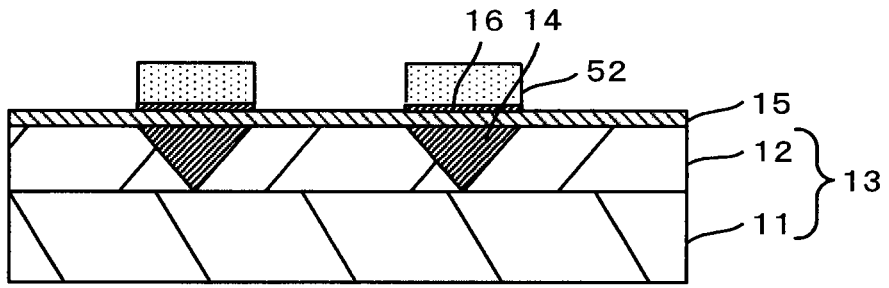
FIGS. 6A, 6B, and 6C are cross-sectional views sequentially showing the manufacturing process of the organic electroluminescence device.

Next, as shown in FIG. 6A, the silicon oxide film 51 is etched by use of an aqueous solution containing hydrofluoric acid, for example, with the left resist film 52 used as a mask. In this way, the insulating film 16 is formed on the transparent electrode 15 at the portion on the transparent electrode 15 in the regions opposed to the metal lines 14.

Figure 6B:
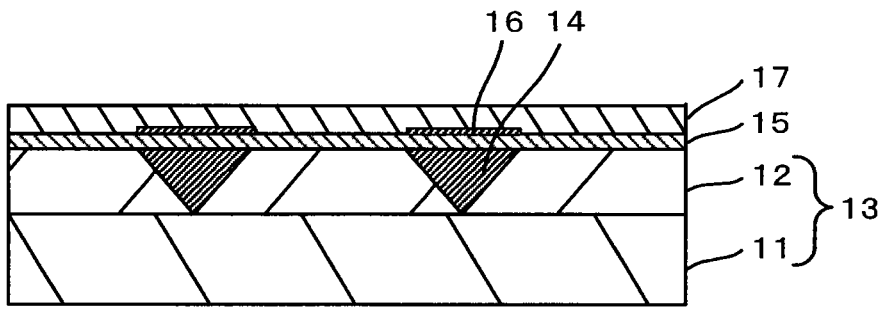

Next, as shown in FIG. 6B, the resist film 52 is removed and then the organic light emitting layer 17 having a thickness of about 100 nm is formed by a coating method on the entire upper surface of the transparent electrode 15 provided with the insulating layer 16. To be more precise, the organic light emitting layer 17 can be formed in such a manner that an organic light emitting material dissolved in a solvent is coated by a spin coating method, a spray method, a screen print method or the like, and then the solvent is dried and evaporated.

Figure 6C:
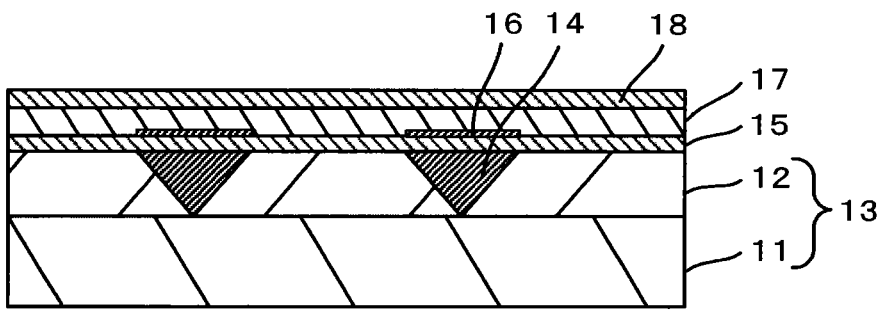

Next, as shown in FIG. 6C, an aluminum film serving as the metal electrode 18 having a thickness of about 300 nm is formed on the organic light emitting layer 17 by a vacuum deposition method, for example. Thus, the organic electroluminescence device 10 shown in FIG. 1 is obtained.

In the manufacturing process of the organic electroluminescence device 10 of the embodiment, only one time of a photolithographic process is required in which the resist film 52 is exposed in a self-aligning manner with the metal lines 14 used as the mask, so as to perform patterning on the silicon oxide film 51, as shown in FIG. 5B.

On the other hand, in a manufacturing process of the organic electroluminescence device 30 of the comparative example, at least four times of photolithographic processes are required in order to perform patterning on the transparent electrode 33 and mesas 31a, patterning on the metal mirrors 36, patterning on the metal lines 38, and patterning on the organic light emitting layer 35 and the metal electrode 34.

Even if the thickness of the high refractive index layer can be increased up to 100 μm, then the organic light emitting layer 35 cannot be formed by the coating method because a large bump is formed between the upper surface of the glass substrate 31 and the upper surface of the high refractive index layer 32.

Even if the bump is planarized by use of polyimide, a difference in the refractive index between the glass substrate and polyimide decreases at the mesa of the high refractive index layer 32. Hence light extraction efficiency is degraded.

As described above, the embodiment employs the composite substrate 13 having the flat upper surface. In the composite substrate 13, the second substrate 12 in which the multiple metal lines 14 are buried and which has the second refractive index n2 higher than the first refractive index n1 is joined onto the first substrate 11 having first refractive index n1.

As a result, the film thickness of the second substrate 12 (between 100 μm and 1 mm, both inclusive) can be increased, so that the pitch P1 of the metal lines 14 (between 1 mm and 10 mm, both inclusive) can be increased to make a light emitting area larger in accordance with the thickness of the second substrate 12.

In the manufacturing of the organic electroluminescence device 10, the organic light emitting layer 17 can be formed by the coating method because the upper surface of the composite substrate 13 is formed flat. Moreover, only one time of the photolithographic process is required in which the insulating layer 16 is formed in the self-aligning manner with the metal lines 14 used as the mask.

Thus, it is possible to achieve an easily manufacturable organic electroluminescence device having a large light emitting area, and a method for manufacturing the organic electroluminescence device.

Here, the second substrate 12 is not heated. However, the second substrate 12 is preferably heated in advance to a temperature higher than a room temperature but lower than the temperature where the second substrate 12 becomes softened. When the second substrate 12 is heated in advance, there is an advantage that the metal lines 14 can be easily pushed into the second substrate 12 in a short time.

Although the embodiment has described the example of the metal lines 14 arranged in the stripe shape, the embodiment is not limited only to this configuration. A lattice shape, a radial shape, an annular shape, or a combined shape of those shapes can be employed in addition to the stripe shape.

When the metal lines 14 are formed into the radial shape, distances between adjacent metal lines are continuously changed. Accordingly, the metal lines are preferably laid out such that the distances remain in a range from 1 mm to 10 mm.

Second Embodiment

Figure 7A:
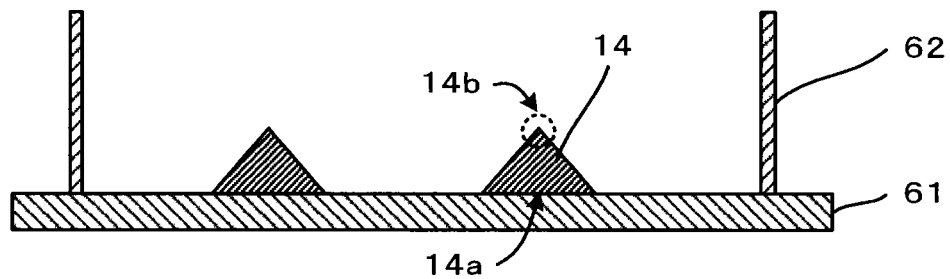
FIGS. 7A, 7B, and 7C are cross-sectional views sequentially showing a manufacturing process of an organic electroluminescence device according to a second embodiment.
Figure 7B:
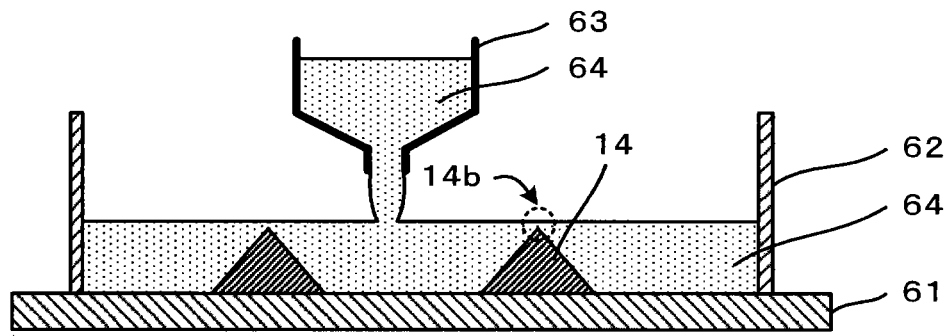
Figure 7C:
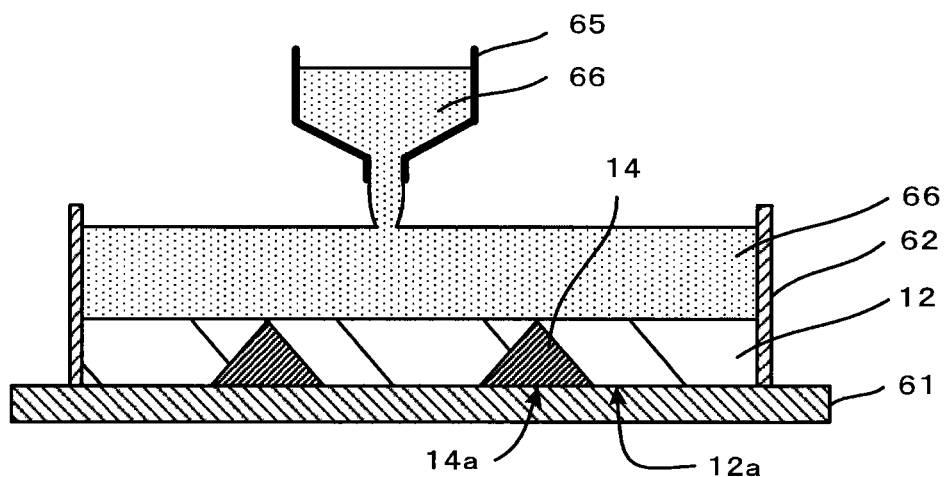

A method for manufacturing an organic electroluminescence device according to a second embodiment will be described with reference to FIGS. 7A to 7C. FIGS. 7A to 7C are cross-sectional views sequentially showing a main portion of a manufacturing process of an organic electroluminescence device of the embodiment.

In the embodiment, the same components in the above-described first embodiment are denoted by the same reference numerals and the relevant explanation will be omitted, and only different features will be described. The embodiment is different from the first embodiment in that the metal lines are buried by dripping fused resin between the wedge-shaped metal lines arranged in parallel and then solidifying the fused resin.

Specifically, as shown in FIG. 7A, after a mold release agent containing silicon oil having a heatproof temperature of about 250° C. as a major component, for example, is coated on a third substrate 61 such as a metal plate having a thickness of about 100 μm, the multiple wedge-shaped metal lines 14 are arranged in parallel at the pitch P1 on the third substrate 61 while the side 14a of the wedge is situated on the third substrate 61. Moreover, a mold form 62 is disposed around the metal lines 11 arranged in parallel.

Next, as shown in FIG. 7B, fused polyimide (a first fused liquid) 64 filled in a dispenser 63 is dripped on the third substrate 61 until the vertexes 14b of the wedges submerge.

Next, the fused polyimide is solidified. In this way, the second substrate 12 in which the multiple wedge-shaped metal lines 14 are buried is formed such that the side 14a of the wedge is flush with the upper surface 12a.

Next, as shown in FIG. 7C, fused polyethylene (a second fused liquid) 66 filled in a dispenser 65 is dripped on the second substrate 12.

Figure 8A:
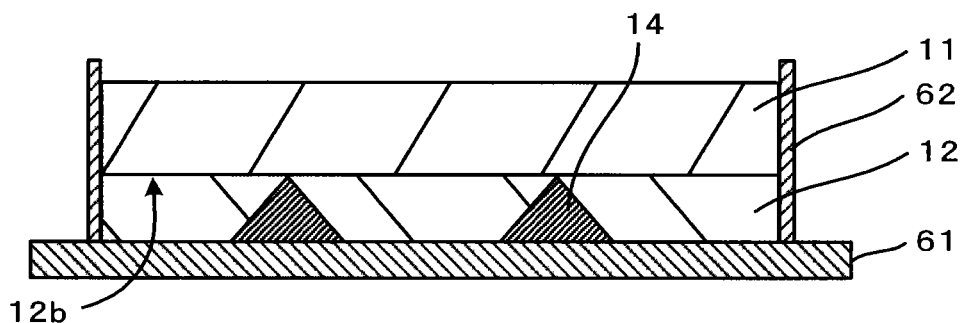
FIGS. 8A, 8B, and 8C are cross-sectional views sequentially showing the manufacturing process of the organic electroluminescence device.

Next, as shown in FIG. 8A, the fused polyethylene is solidified. In this way, the first substrate 11 is joined to the lower surface 12b of the second substrate 12.

Figure 8B:
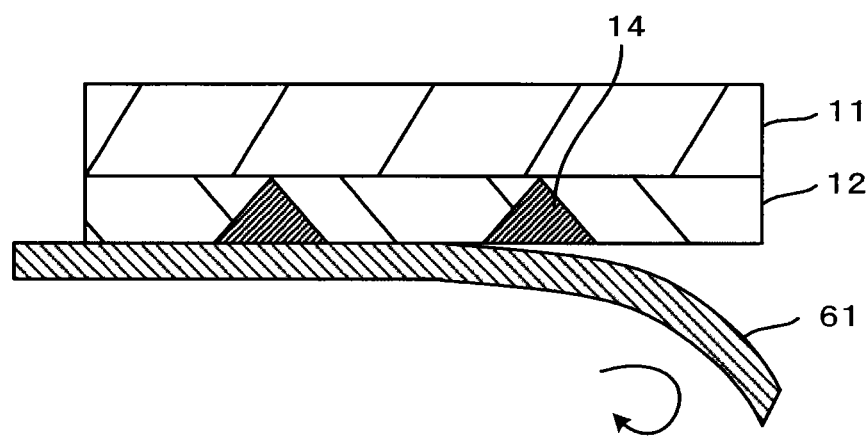

Next, as shown in FIG. 8B, the first substrate 11 is suctioned by and fixed to a vacuum chuck and then the third substrate 61 is peeled off the second substrate 12 in a rolling manner.

Figure 8C:
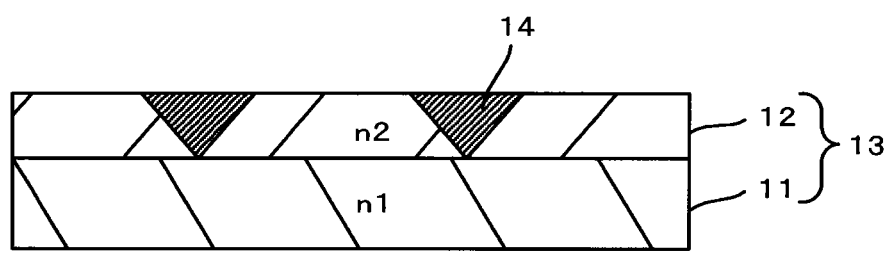

Next, as shown in FIG. 8C, the mold form (not shown) 62 is removed to obtain the composite substrate 13 having the flat upper surface. In the composite substrate 13, the second substrate 12 in which the multiple metal lines 14 are buried and which has the second refractive index n2 higher than the first refractive index n1 is joined onto the first substrate 11 having first refractive index n1.

Next, the transparent electrode 15, the insulating layer 16, the organic light emitting layer 17, and the metal electrode 18 are formed in accordance with the process shown in FIGS. 5A to 6C. Hence the organic electroluminescence device 10 shown in FIG. 1 is obtained.

As described above, in the embodiment, the metal lines 14 are buried in the second substrate 12 by dripping and solidifying the fused polyimide between the wedge-shaped metal lines 14 arranged in parallel, and the first substrate 11 is joined to the second substrate 12 by dripping and solidifying the fused polyethylene onto the second substrate 12.

In this way, it is possible to bury the metal lines 14 in the second substrate 12 and to join the first substrate 11 to the second substrate 12 in the same process in a continuous manner. Accordingly, there is an advantage to shorten the manufacturing process. Therefore, there is an advantage to reduce time and cost.

Here, the embodiment has described the example to peel the third substrate 61 off the second substrate 12 in the rolling manner. Instead, the third substrate 61 can also be removed by etching. For example, when the metal lines 14 are made of gold and the third substrate 61 is made of aluminum, etching can be performed by use of an aqueous solution containing an aluminum etchant such as phosphoric acid.

What is claimed is:

1. An organic electroluminescence device, comprising:
   a first substrate having a first refractive index;
   a second substrate being joined to an upper surface of the first substrate and having a second refractive index higher than the first refractive index;
   a plurality of wedge-shaped metal lines each being buried in the second substrate in such a manner that one side of the wedge-shaped metal line is flush with an upper surface of the second substrate;
   a transparent electrode formed on the upper surface of the second substrate and the plurality of metal lines;
   an insulating layer formed on a portion of the transparent electrode opposed to each of the plurality of metal lines;
   an organic light emitting layer formed on the transparent electrode on which the insulating layer is formed; and
   a metal electrode formed on the organic light emitting layer.

2. The organic electroluminescence device according to claim 1, wherein
   the organic light emitting layer is formed by coating an organic light emitting material on the transparent electrode on which the insulating film is formed.

3. The organic electroluminescence device according to claim 1, wherein
   the first substrate and the second substrate are made of plastics.

4. The organic electroluminescence device according to claim 1, wherein
   the plurality of metal lines are arranged in parallel,
   a distance between the adjacent metal lines is between 1 mm and 10 mm, both inclusive, and
   the second substrate has a thickness between 0.1 mm and 1 mm, both inclusive.

* * * * *